United States Patent
Schlachter et al.

(10) Patent No.: US 8,797,081 B2
(45) Date of Patent: Aug. 5, 2014

(54) CIRCUIT FOR THE CLOCKING OF AN FPGA

(75) Inventors: Marc Schlachter, Wehr (DE); Romuald Girardey, Huningue (FR)

(73) Assignee: Endress + Hauser GmbH + Co. KG, Maulburg (DE)

( * ) Notice: Subject to any disclaimer, the term of this patent is extended or adjusted under 35 U.S.C. 154(b) by 0 days.

(21) Appl. No.: 13/696,945

(22) PCT Filed: Apr. 14, 2011

(86) PCT No.: PCT/EP2011/055947
§ 371 (c)(1),
(2), (4) Date: Nov. 8, 2012

(87) PCT Pub. No.: WO2011/151103
PCT Pub. Date: Dec. 8, 2011

(65) Prior Publication Data
US 2013/0063194 A1 Mar. 14, 2013

(30) Foreign Application Priority Data
May 12, 2010 (DE) .......................... 10 2010 028 963

(51) Int. Cl.
*H03K 3/00* (2006.01)
(52) U.S. Cl.
USPC ........... 327/291; 327/147; 327/156; 327/159; 375/373
(58) Field of Classification Search
USPC ........................................................ 327/291
See application file for complete search history.

(56) References Cited

U.S. PATENT DOCUMENTS

| 4,937,846 | A | 6/1990 | Malka et al. |
| 5,459,435 | A | 10/1995 | Taki |
| 7,417,510 | B2 * | 8/2008 | Huang ............................ 331/74 |
| 2004/0239431 | A1 | 12/2004 | Tan |
| 2005/0104644 | A1 | 5/2005 | Montperrus et al. |
| 2007/0233912 | A1 | 10/2007 | Piasecki et al. |

(Continued)

FOREIGN PATENT DOCUMENTS

| DE | 10 2008 012 285 B3 | 7/2009 |
| WO | 2008/132583 A1 | 11/2008 |
| WO | 2008/144917 A1 | 12/2008 |

OTHER PUBLICATIONS

Linear Technology, LTC6906 data sheet, Rev. C, 2005.*
German Search Report in 10 2010 028 963.9, dated Jan. 11, 2011.
International Search Report in PCT/EP2011/055947, dated Jul. 29, 2011.
International Search Report in PCT/EP2011/055947, dated Nov. 13, 2012, English translation thereof.

*Primary Examiner* — Long Nguyen
*Assistant Examiner* — Patrick Chen
(74) *Attorney, Agent, or Firm* — Bacon & Thomas, PLLC

(57) ABSTRACT

The circuit for the clocking of an FPGA comprises an FLL-circuit; a reference clock of a first frequency, or a reference clock input for the reception of a signal of a reference clock of a first frequency; and a digitally controlled oscillator, which outputs a clocking signal for the FPGA, wherein the FLL-circuit is designed in order to register a first number of clocking signals from the digitally controlled oscillator during a second number of periods of the reference clock, the first number is larger than the second number, and, in order to give out a feedback signal to control the ratio between the first number and the second number, as the feedback signal acts on the frequency of the digitally controlled oscillator.

12 Claims, 3 Drawing Sheets

(56) References Cited

U.S. PATENT DOCUMENTS

| | | | |
|---|---|---|---|
| 2008/0218282 A1* | 9/2008 | Waheed et al. | 331/1 A |
| 2008/0272810 A1* | 11/2008 | Edwards et al. | 327/156 |
| 2010/0013532 A1* | 1/2010 | Ainspan et al. | 327/159 |
| 2010/0019855 A1 | 1/2010 | Barrow et al. | |
| 2010/0026352 A1 | 2/2010 | Jacobowitz et al. | |
| 2010/0090771 A1 | 4/2010 | Shin | |

* cited by examiner

CIRCUIT FOR THE CLOCKING OF AN FPGA

TECHNICAL FIELD

The present invention concerns a circuit for the clocking of an FPGA (Field-Programmable Gate Array). FPGAs with low power consumption are known.

BACKGROUND DISCUSSION

In measurement technology FPGAs can be employed, by way of example, which comprise a current load of around 80 μA. On the other hand, applications in measurement technology require, by way of example, precise clocking, i.e. the deviation from the fundamental frequency should not account for more than +/−0.1% or +/−0.2% as the case may be. Such precise clocking with low power consumption cannot be readily provided by commercially available oscillators. It would be possible to generate a very precise clock signal with a PLL (Phase-Locked Loop) circuit integrated into the FPGA, which produces a higher clock frequency, which is based on an external reference clock. However, such PLL-circuits have the disadvantage that their power consumption is too large. As they are, they account for a typical power consumption of around 1 mA, i.e. about 12 times the above mentioned power consumption of the FPGA on its own. This makes the provision of a system clock by means of an integrated PLL-circuit unattractive.

SUMMARY OF THE INVENTION

It is therefore the object of the present invention to provide a circuit, which overcomes the disadvantages of the prior art. It is therefore the object of the present invention to provide a circuit, which overcomes the disadvantages of the prior art. The inventive circuit comprises an FPGA, which comprises an FLL-circuit; a reference clock of a first frequency, or a reference clock input for the reception of a signal of a reference clock of a first frequency; a digitally controlled oscillator, which outputs a clocking signal for the FPGA, wherein the FLL-circuit is designed in order to register a first number of clock signals from the digitally controlled oscillator during a second number of periods of the reference clock, wherein the first number is larger than the second number, and, in order to give out a feedback signal to control the ratio between the first number and the second number, as the feedback signal acts on the frequency of the digitally controlled oscillator.

In a further embodiment of the invention, the frequency of the digitally controlled oscillator is, due to the feedback signal, not variable by more than 5%, in particular by not more than 2% and preferably by not more than 1%.

In a presently preferred embodiment of the invention, the number of clocking signals from the digitally controlled oscillator is registered during one period of the reference clock. In this case, the second number is then 1. Evidently, the second number can also take on another value, such as 2, 3, 4, or 5, for example.

The ratio between the first number and the second number comprises a preset or presettable desired value, which is larger than 10:1, preferably larger than 100:1 and especially preferably not smaller than 500:1.

The frequency of the digitally controlled oscillator is controlled, according to an embodiment of the invention, via at least one resistance value, on which the feedback signal acts.

In an embodiment of the invention, the resistance value is adjustable via a series of individual resistors, which, for the reduction of the resistance, can be selectively bypassed with respect to ground, at least in part. The series of the resistors that can be selectively bypassed, account for, by way of example, not more than 20%, and in particular not more than 10% of the total value of the resistance. The series of resistors that can be bypassed, by way of example, comprises at least 5, in particular at least 10 and preferably at least 20 individual resistors.

The series of individual resistors, according to a further embodiment of the invention, comprises at least one resistive element with a variable resistive value. The variable resistance value can thereby in particular be varied between a minimum value and a maximum value, wherein, in particular for the case where the resistive elements that can be bypassed all comprise the same resistive value, the maximum value equals the resistive value of the resistive elements that can be bypassed. The minimum value is as small as possible; in particular, it accounts for less than 5%, preferably less than 2% and especially preferably less than 1% of the maximum value. In this way, the total value of the resistance, which controls the digitally controlled oscillator, can be adjusted in an almost continuous way by bypassing select resistive elements and adjusting the in-between values by means of the variable resistive element.

$$R_{total} = R_0 + i * R_{individual} + \alpha * R_{individual}$$

Wherein $R_0$ is a fixed base resistance value that accounts for, by way of example, 80% or more of the total resistance, and wherein $R_{individual}$ is the resistive value of the individual resistive elements that can be bypassed, That is $$R_{individual} = (R_{total} - R_0)/N$$

Wherein N−1 is the number of the resistors that can be bypassed,

Wherein i=0, 1, ... N−1, and

Wherein a=0 ... 1.

The parameter 'i' designates then the number of individual resistors that contribute to the total resistance value, while the factor 'a' designates the effective contribution of the continuously adjustable resistive element as a fraction of its maximum resistance $R_{individual}$.

For the case where no variable resistive element is provided, then:

$$R_{total} = R_0 * R_{individual}$$

applies in particular, where:

$$R_{individual} = (R_{total} - R_0)/N$$

wherein N is the number of resistors that can be bypassed, and wherein i=0, 1, ... N.

In a further embodiment of the invention, the resistance value is adjustable via a network of at least partially bypassable, individual resistors, wherein the network comprises resistors arranged in parallel and in series.

In a further embodiment of the invention, the first frequency of the reference clock is not less than 10 Hz, in particular not less than 50 Hz, and especially preferably not less than 100 Hz. The frequency of the reference clock is, according to this further embodiment of the invention, not more than 1 kHz, in particular not more than 500 Hz, and especially preferably not more than 250 Hz.

The FLL-circuit, according to a further embodiment of the invention, can furthermore comprise a scaling component for the output of a third frequency $f_3$, wherein the third frequency $f_3$ is given as a ratio, N:M, to the second frequency $f_2$, so that $M*F_3 = N*f_2$.

BRIEF DESCRIPTION OF THE DRAWINGS

The invention is described with the help of the illustrative embodiments in the following figures.

DETAILED DISCUSSION IN CONJUNCTION WITH THE DRAWINGS

Figure 1:
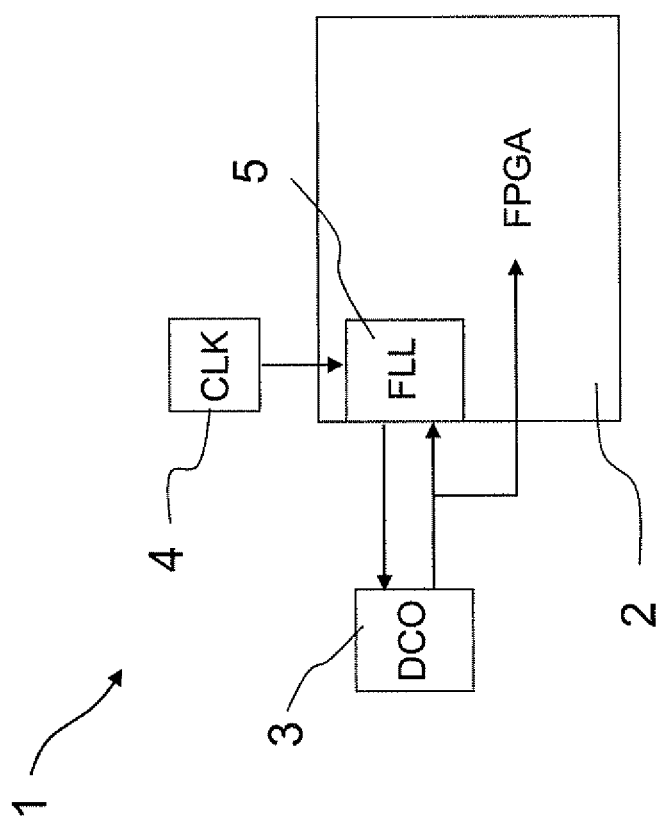
FIG. 1: a schematic illustration of the inventive circuit.
Figure 2:
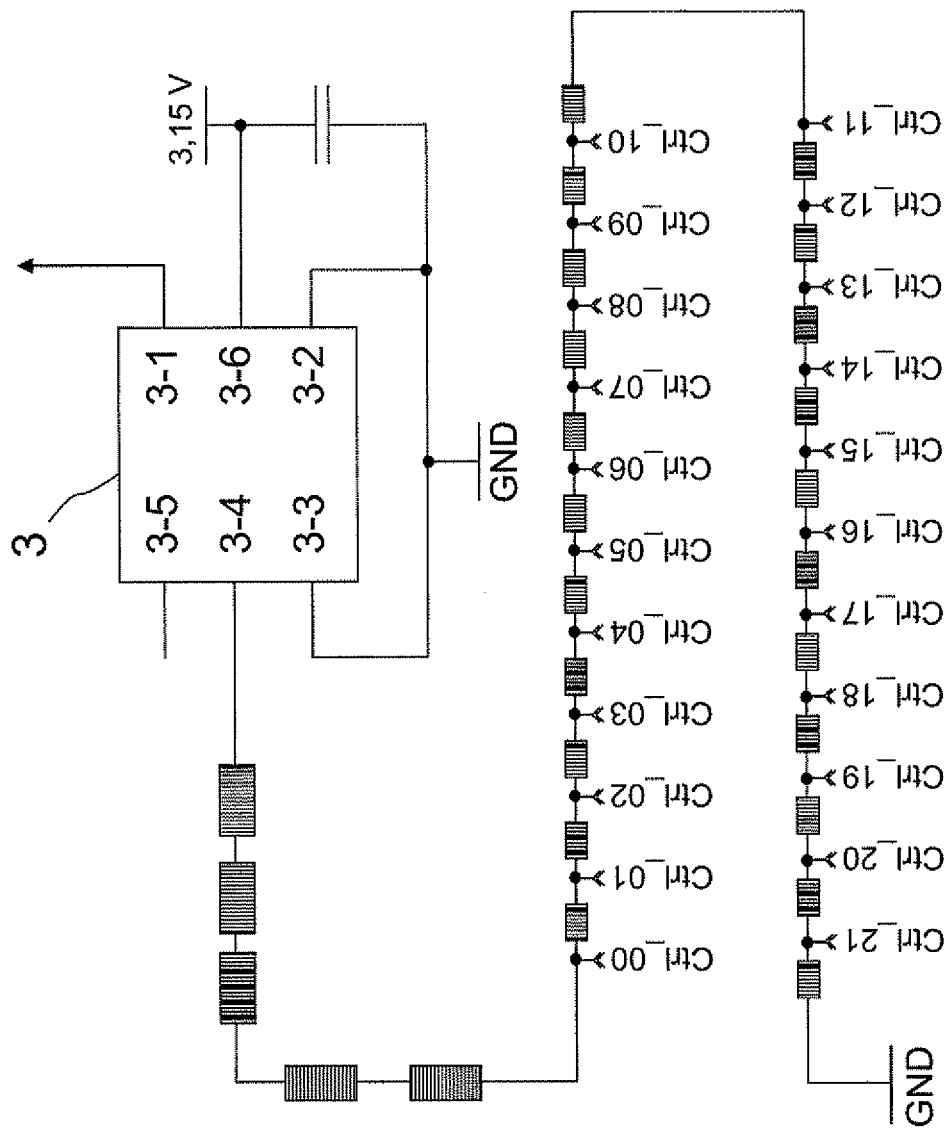
FIG. 2: a block circuit diagram for the control of a digitally controlled oscillator, by means of a chain of resistors.

The circuit 1 illustrated in FIG. 1 comprises an FPGA 2, a digitally controllable oscillator 3, a reference clock 4 with a low clock frequency, and an FLL-circuit 5 (Frequency Locked Loop), wherein the FLL-circuit receives on the one hand the low frequency input from the reference clock 4 and the high frequency input from the digitally controlled oscillator 3. The reference clock and the digitally controlled oscillator are external components that are connected to the FPGA. Thus, the FLL-circuit controls the higher frequency output of the digitally controlled oscillator with respect to the lower frequency signal of the reference clock by means of a counting method. In this, an edge triggered counting of the higher frequency signal occurs during the window of time preset by the reference clock, and this is then compared with a desired value. The frequency of the digitally controlled oscillator is increased or decreased depending on the result of the comparison. The digitally controlled oscillator is an external, resistor controlled oscillator, with low energy consumption in the presently preferred embodiment of the invention, by way of example, the LTC 6906. This digitally controlled oscillator can generate a signal between 10 kHz and 1 MHz, wherein the current drawn, at a supply voltage of about 3.15 V and a signal frequency of around 300 kHz, is on the order of 20 μA. The pin configuration of the digitally controlled oscillator 3 is illustrated in detail in FIG. 2. The pins of the digitally controlled oscillator 3 are used in the following way:

3-1: clock with a frequency of between 10 kHz and 1 MHz
3-2: circuit ground
3-3: voltage divider
3-4: control input
3-6: voltage supply input The voltage divider input 3-3 is grounded, so that the clock 3-1 outputs an unaltered signal frequency. A series circuit of resistive elements is provided at the control input 3-4, which is chosen so that a desired value between about 300 kHz and 330 kHz, in particular about 314 kHz, is outputted as a clock signal. The chain of resistors comprises a number of resistive elements that cannot be bypassed and, when taken together, comprise a resistive value of about 318 kΩ. To this is connected a chain of 22, 680Ω, resistors that can be bypassed. The resistive elements can be bypassed by means of the FPGA 2, wherein by making a connection to one of the control pins Control 0 to Control 21, a portion of the resistor chain is bypassed with respect to ground. It is possible, in this way, to reduce the total of value of the effective resistance, in discrete steps, up to about 5%. The desired frequency is reached, under ideal conditions, at 97.5% of the total value, so that deviations in the value of the resistance or in the oscillator due to, by way of example, temperature changes or because of manufacturing tolerances, the frequency can be increased or decreased by making a connection with another control pin. Whether or not the control pin that is presently chosen is too high or low, is determined is from the comparison of the desired value to the clock signal of the digitally controlled oscillator during one period of the reference clock.

Figure 3:
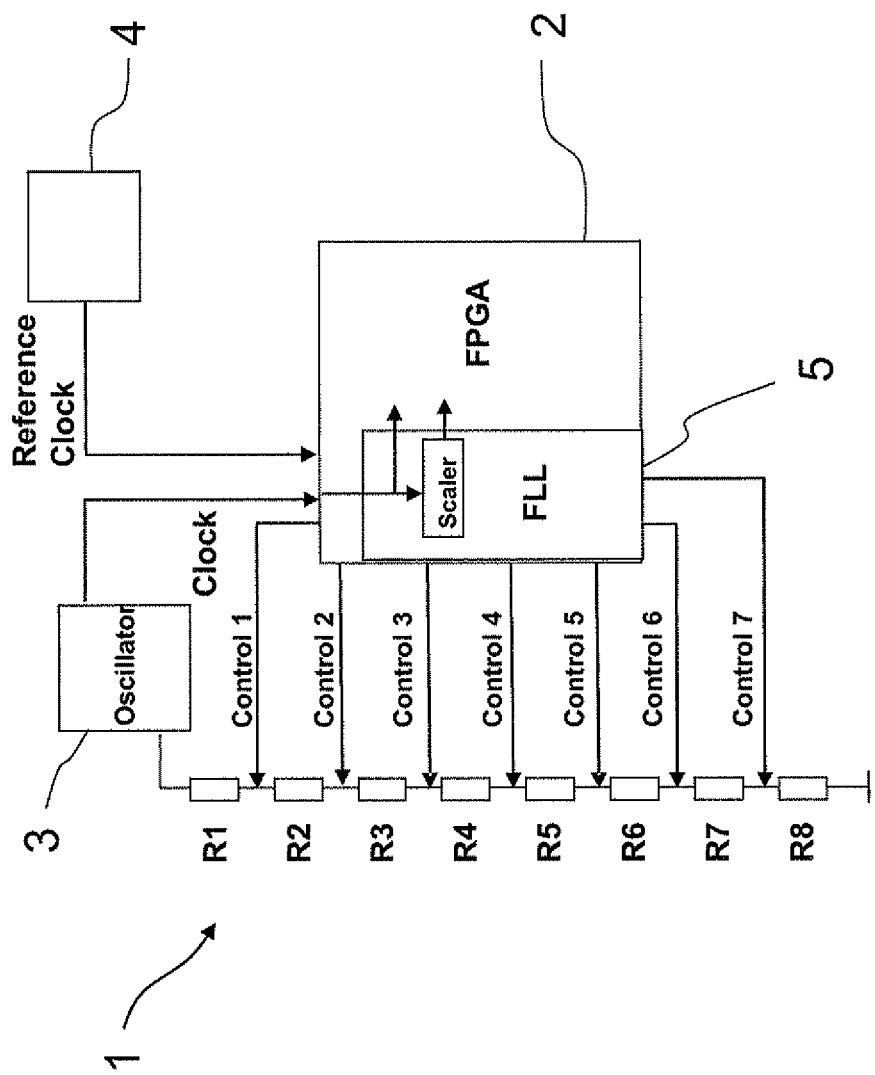
FIG. 3: a block circuit diagram of the circuit, according to the invention, with control of a digitally controlled oscillator by means of an FPGA by means of a chain of resistors.

FIG. 3 shows an overview, wherein for the sake of simplicity, only 7 control pins, control 1 to control 7, which can bypass part of the resistor chain, are illustrated.

By way of example, the chain of resistors can be bypassed at the control pin Control 4 as an initial default value, wherein, depending on deviations from the desired value to the counted clock signal of the digitally controlled oscillator, another control pin is activated in order to increase or lower the clock frequency.

The energy consumption for the control of the control nodes and the FLL-circuit accounts for about 10 μA (at a voltage supply of 3.15 V), so that the total current draw for the generation of a rapid and acceptably precise clocking is around 30 μA at the present supply voltage. This represents a decrease in the power consumption vis-à-vis the current PLL-circuits, which comprise a current draw of about 1 mA at the present supply voltage, by a factor of more than 30.

By nature, switching between discrete resistance values implies the result that the clock frequency of the oscillator will comprise a certain amount of jitter if the frequency is not randomly achieved by a preset resistor configuration. In case the jitter is undesirable, the resistor chain can comprise an additional variable resistor, whose value can be continuously controlled.

Furthermore, instead of a row of resistors with many resistive elements of equal value, a resistance network can be employed, with parallel and series resistive circuit elements, with which other incremental values can be formed as whole number multiples of a resistive element.

Further embodiments and possible variations of the invention present themselves for persons skilled in the art in the context of the present disclosure without deviating from the core of the invention.

The invention claimed is:

1. A circuit comprising:
an FPGA, which comprises an FLL-circuit;
a reference clock of a first frequency, or a reference clock input for the reception of a signal of a reference clock of a first frequency;
a digitally controlled oscillator, which outputs a clocking signal for said FPGA, wherein:
the FLL-circuit is designed in order to register a first number of clock signals from said digitally controlled oscillator during a second number of periods of the reference clock;
the first number is larger than the second number, and, in order to give out a feedback signal to control the ratio between the first number and the second number, as the feedback signal acts on the frequency of said digitally controlled oscillator;
the frequency of the digitally controlled oscillator is controlled via at least one resistance value, on which the feedback signal acts;
the resistance value is adjustable via a series of individual resistors, which, for the reduction of the resistance, can be selectively bypassed with respect to ground, at least in part;
the series of the resistors that can be selectively bypassed account for, not more than 10% of the total value of the resistance;
the series of resistors that can be bypassed comprises at least 10 individual resistors; and
the frequency of the digitally controlled oscillator is, due to the feedback signal, not variable by more than 5%.

2. The circuit as claimed in claim 1, wherein:
the frequency of said digitally controlled oscillator is, due to the feedback signal, not variable by more than 2%.
3. The circuit as claimed in claim 1, wherein:
the second number is 1.
4. The circuit as claimed in claim 1, wherein:
the ratio between the first number and the second number comprises a preset or presettable desired value, which is larger than 10:1.
5. The circuit as claimed in claim 1, wherein:
the series of individual resistors comprises at least one resistive element with a variable resistive value.
6. The circuit as claimed in claim 1, wherein:
the first frequency of said reference clock is not less than 10 Hz.
7. The circuit as claimed in claim 1, wherein:
the frequency of said reference clock is not more than 1 kHz.
8. The circuit as claimed in claim 1, wherein:
said FLL-circuit can furthermore comprise a scaling component for the output of a third frequency $f_3$; and
said third frequency $f_3$ given as a ratio, N:M, to said second frequency $f_3$.
9. The circuit as claimed in claim 1, wherein:
the first frequency of said reference clock is less than 50 Hz.
10. The circuit as claimed in claim 1, wherein:
the first frequency of said reference clock is not less than 100 Hz.
11. The circuit as claimed in claim 1, wherein:
the frequency of said reference clock is not more than 1 kHz.
12. The circuit as claimed in claim 1, wherein:
the frequency of said reference clock is not more than 500 Hz.

* * * * *